(12) United States Patent
Ogawa et al.

(10) Patent No.: US 7,541,117 B2
(45) Date of Patent: Jun. 2, 2009

(54) MASK PATTERN GENERATING METHOD

(75) Inventors: Kazuhisa Ogawa, Kanagawa (JP);
Satomi Nakamura, Kanagawa (JP);
Kohichi Nakayama, Kanagawa (JP)

(73) Assignee: Sony Corporation, Tokyo (JP)

( * ) Notice: Subject to any disclaimer, the term of this patent is extended or adjusted under 35 U.S.C. 154(b) by 252 days.

(21) Appl. No.: 11/735,778

(22) Filed: Apr. 16, 2007

(65) Prior Publication Data
US 2007/0283313 A1 Dec. 6, 2007

(30) Foreign Application Priority Data
Apr. 18, 2006 (JP) .............................. P2006-114827

(51) Int. Cl.
*G03C 5/00* (2006.01)
*G03F 9/00* (2006.01)
(52) U.S. Cl. .......................... 430/5; 430/313; 430/396; 430/311
(58) Field of Classification Search ................ 430/5, 430/313, 311, 312, 394, 396
See application file for complete search history.

(56) References Cited

U.S. PATENT DOCUMENTS 6,861,178 B2 * 3/2005 Kikuchi ........................ 430/5
6,969,580 B2 * 11/2005 Minami ....................... 430/313
2002/0177051 A1 * 11/2002 Kikuchi ........................ 430/5
2003/0096177 A1 * 5/2003 Iwasaki ........................ 430/5

FOREIGN PATENT DOCUMENTS

| JP | 2000-124332 | 4/2000 |
|----|-------------|--------|
| JP | 2000-258892 | 9/2000 |
| JP | 2001-305714 | 11/2001 |
| JP | 2002-351047 | 12/2002 |
| JP | 2005-201967 | 7/2005 |
| JP | 2005-227666 | 8/2005 |

OTHER PUBLICATIONS

Japanese Office Action dated Jun. 24, 2008 from Application No. 2006-114827.

* cited by examiner

*Primary Examiner*—Nikita Wells
*Assistant Examiner*—Johnnie L Smith
(74) *Attorney, Agent, or Firm*—Sonnenschein Nath & Rosenthal LLP

(57) ABSTRACT

Disclosed herein is a mask pattern generating method for generating a mask pattern to be formed in a Levenson phase shift mask used in a light exposure process for exposing a photoresist film formed on a fabricated film to be patterned into a conductive layer to light when the conductive layer is patterned by photolithography, the conductive layer including a gate electrode formed in an active region extending in a first direction in a wafer in such a manner as to extend in a second direction orthogonal to the first direction, the mask pattern generating method including: a phase shifter arranging step; a shifter pattern image obtaining step; a trim pattern image obtaining step; and a phase shifter elongating step.

4 Claims, 10 Drawing Sheets

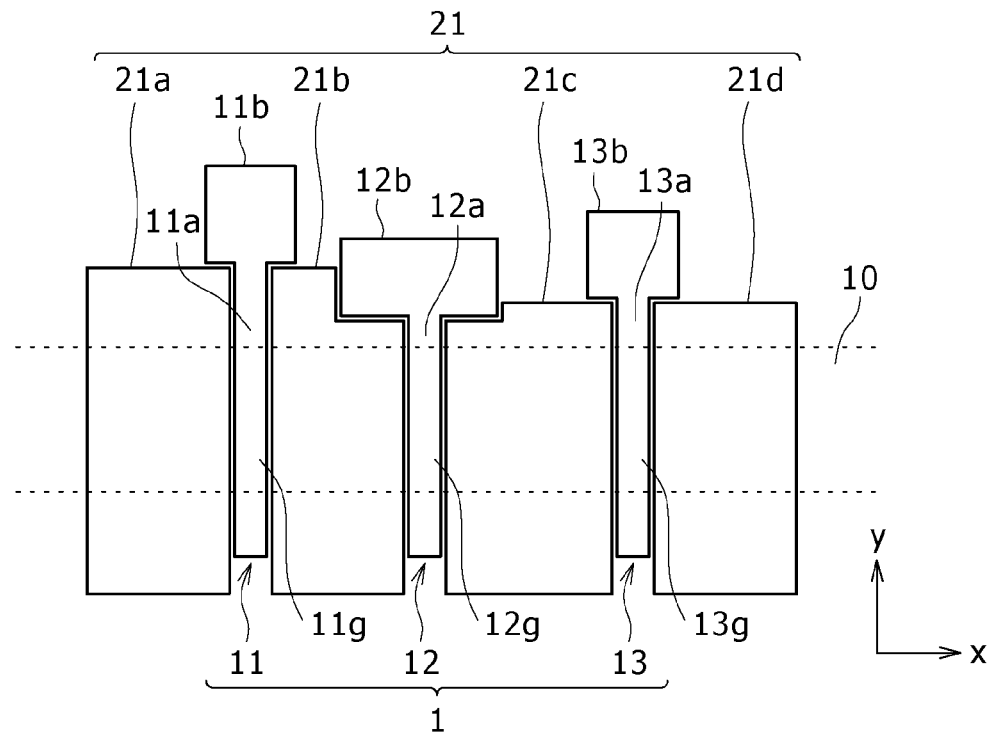
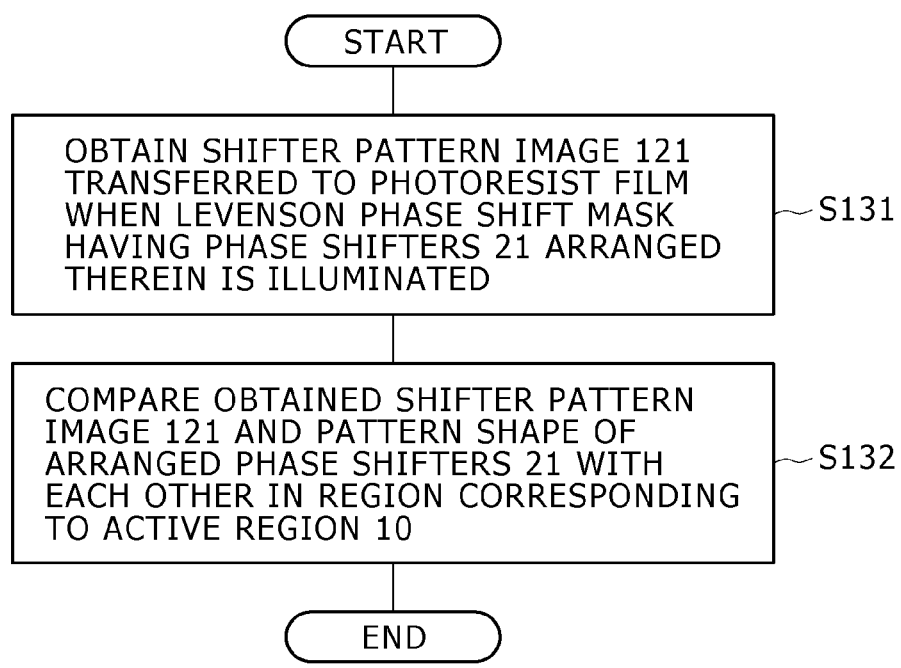

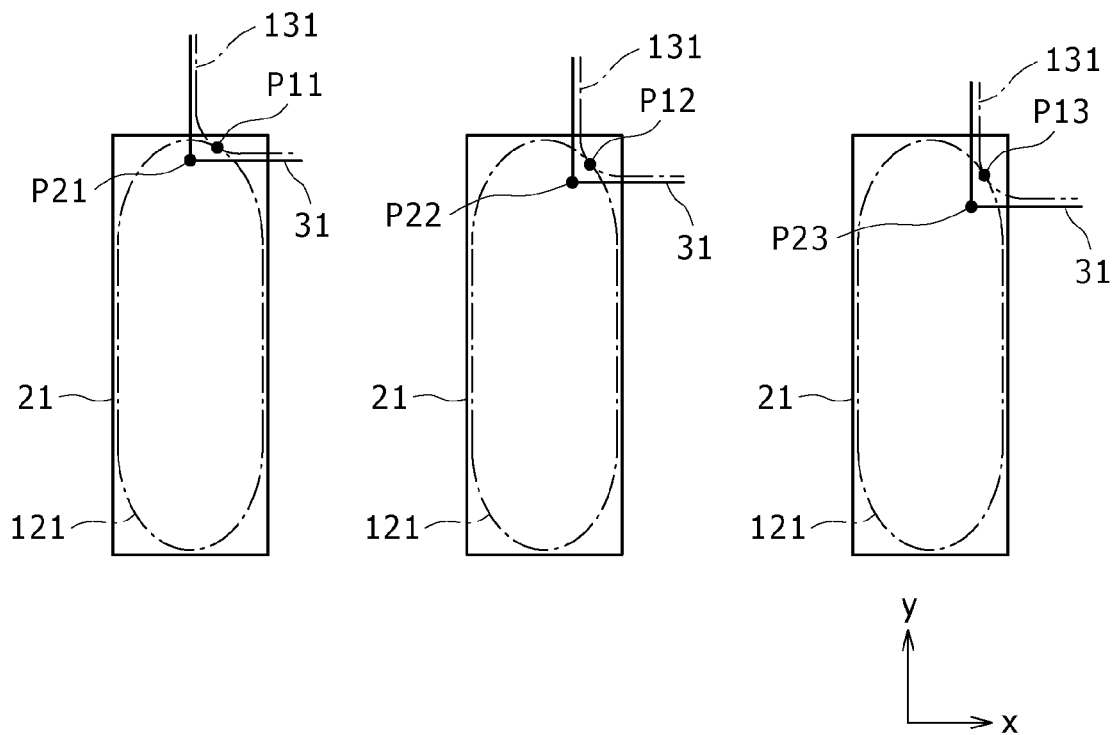
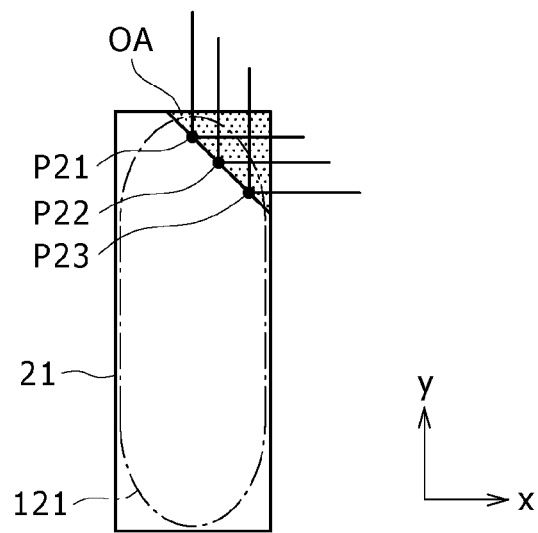

MASK PATTERN GENERATING METHOD

CROSS REFERENCES TO RELATED APPLICATIONS

The present invention contains subject matter related to Japanese Patent Application JP 2006-114827 filed in the Japan Patent Office on Apr. 18, 2006, the entire contents of which being incorporated herein by reference.

BACKGROUND OF THE INVENTION

1. Field of the Invention

The present invention relates to a mask pattern generating method, and particularly to a mask pattern generating method for generating a mask pattern for a Levenson phase shift mask used when a conductive layer having gate electrodes is patterned by photolithography.

2. Description of the Related Art

When a semiconductor device is manufactured, a fine pattern is formed on a wafer by photolithography.

In this case, first, a photoresist film of a photosensitive material is formed on a surface of a fabricated film formed on the wafer. Thereafter a photomask having a mask pattern formed therein is illuminated, whereby a mask pattern image produced by the illumination is transferred to the photoresist film, and thus light exposure is performed. The resist film to which the mask pattern is transferred is thereafter developed to form a photoresist mask over the wafer. Then, the fabricated film is etched using the photoresist mask, whereby the pattern is formed.

In this lithography technology, a fine pattern is demanded to be formed at a high resolution in order to meet demands for a higher degree of integration of semiconductor devices and higher operating speed.

As a method for making a fine pattern, a multiple exposure method using a Levenson phase shift mask as a photomask is employed (see Japanese Patent Laid-Open No. 2002-351047, Japanese Patent Laid-Open No. 2005-201967, Japanese Patent Laid-Open No. 2005-227666 and Japanese Patent Laid-Open No. 2000-258892, for example).

The Levenson phase shift mask is referred to as an alternating phase arrangement type. The Levenson phase shift mask has a plurality of line-shaped phase shifters successively arranged so that transmitted light is alternately inverted in phase. The phase shifters are formed as a mask pattern by trenching a mask substrate made of quartz, for example.

In the multiple exposure method using this Levenson phase shift mask, a shifter pattern image transfer process and a trim pattern image transfer process are performed. In the shifter pattern image transfer process, a shifter pattern image produced by irradiating the Levenson phase shift mask having phase shifters formed therein as a mask pattern with light is transferred to a photoresist film. On the other hand, in the trim pattern image transfer process, a trim pattern image produced by irradiating a trim mask, which is a photomask other than the Levenson phase shift mask and has a trim pattern formed therein, with light is further transferred to the photoresist film.

This multiple exposure method has been put to practical use to form a conductive layer such as a gate wiring layer including gate electrodes in a ULSI or the like. In the conductive layer, parts made to function as the gate electrodes need to be patterned with a fine width. For this, the Levenson phase shift mask is used in which a plurality of phase shifters are arranged so as to correspond to the parts forming the gate electrodes.

FIGS. 13A, 13B, and 13C are plan views showing the conductive layer including the gate electrodes, and the Levenson phase shift mask and the trim mask used to form the conductive layer.

FIG. 13A is a plan view showing the conductive layer 203. FIG. 13B is a plan view showing the Levenson phase shift mask used to form the conductive layer 203 of FIG. 13A. In FIG. 13B, a hatched region is a light shielding part 204 of the Levenson phase shift mask, and regions other than the hatched region are phase shifters 205a and 205b, which transmit light. FIG. 13C is a plan view showing the trim mask used to form the conductive layer 203 of FIG. 13A. In FIG. 13C, a hatched region is a light shielding part 301 of the trim mask, and a region other than the hatched region is a light transmitting part 302.

As shown in FIG. 13A, the conductive layer 203 is formed on a wafer having an active region 201 formed therein. The conductive layer 203 is formed of polysilicon, for example. In the conductive layer 203, parts corresponding to the active region 201 are formed in the shape of lines, and function as gate electrodes 203g. In the active region 201, regions facing the gate electrodes 203g function as channel regions. In the conductive layer 203, a gate contact (not shown) is formed at parts formed on a region other than the active region 201. In order to reduce wiring resistance and facilitate pattern formation, the parts formed on the region other than the active region 201 are processed into line width greater than line width of the parts formed in the shape of lines in a region corresponding to the active region 201. Incidentally, parts other than the active region 201 and the conductive layer 203 are formed so as to function as a device isolation region.

As shown in FIG. 13, the Levenson phase shift mask has the light shielding part 204 and the phase shifters 205a and 205b. The plurality of phase shifters 205a and 205b are arranged so as to correspond to the gate electrodes 203g. In this case, regions for forming the gate electrodes 203g are formed by the light shielding part 204, and the phase shifters 205a and 205b are arranged in pairs such that the light shielding part 204 is interposed between the phase shifters 205a and 205b. The phase shifters 205a and 205b extend along an extending direction of the gate electrodes 203g. One pair of phase shifters 205a and 205b is formed such that the phase of light transmitted by the phase shifter 205a and the phase of light transmitted by the phase shifter 205b are inverted with respect to each other. Thus, between the pair of phase shifters 205a and 205b, pieces of diffracted light cancel each other out, and therefore the absolute value of light intensity is decreased. Hence, light exposure can be performed while the pattern between the phase shifters 205a and 205b is separated.

As shown in FIG. 13C, the trim mask has the light shielding part 301 and the light transmitting part 302. The light shielding part 301 is patterned so as to correspond to the pattern shape of the conductive layer 203.

In forming the conductive layer 203 shown in FIG. 13A, the shifter pattern image transfer process in which a shifter pattern image is transferred using the Levenson phase shift mask as shown in FIG. 13B and the trim pattern image transfer process in which a trim pattern image is transferred using the trim mask as shown in FIG. 13C are performed. In this case, a region where the light shielding part 204 of the Levenson phase shift mask and the light shielding part 301 of the trim mask overlap each other is a dark part not irradiated with exposure light. Thus, when a positive type photoresist film is subjected to multiple exposure by the shifter pattern image transfer process and the trim pattern image transfer process as described above and then developed, the photoresist film is patterned with a photoresist material remaining in the dark part. Then, a fabricated film is etched using the photoresist pattern as a mask, whereby the conductive layer 203 can be patterned as shown in FIG. 13A.

SUMMARY OF THE INVENTION

However, when pattern transfer is performed as described above, it can be difficult to transfer the pattern to the photoresist film in such a manner as to correspond to a desired design pattern.

FIG. 14 is a plan view showing phase shifters 205a and 205b of the Levenson phase shift mask, shifter pattern images 215a and 215b produced by illuminating the phase shifters 205a and 205b, and a gate electrode 203g formed as a result of multiple exposure using the Levenson phase shift mask. In FIG. 14, the phase shifters 205a and 205b of the Levenson phase shift mask are indicated by alternate long and short dash lines. The shifter pattern images 215a and 215b produced by illuminating the phase shifters 205a and 205b are indicated by a dotted line. Then, FIG. 14 shows a design pattern 203p of the gate electrode 203g and a transfer pattern 203t of the part of the gate electrode 203g formed as a result of multiple exposure using the Levenson phase shift mask and the trim mask.

As shown in FIG. 14, in a region corresponding to the active region 201 in the design pattern 203p of the conductive layer 203, a proximity effect occurs in which light is diffracted at corner parts of the phase shifters 205a and 205b of the Levenson phase shift mask, and therefore corner parts of the shifter pattern images 215a and 215b produced by illuminating the phase shifters 205a and 205b may be rounded. Thus, the gate electrode 203g is not formed with a desired line width so as to correspond to the design pattern 203p in the active region 201. For example, as shown in FIG. 14, the transfer pattern 203t of the gate electrode 203g formed as a result of the multiple exposure is formed including a part of a longer gate length than the design pattern 203p in the active region 201. Therefore desired transistor characteristics may not be obtained easily. In addition, a short circuit may occur between the conductive layer 203 and another adjacent conductive layer (not shown).

As described above, when a semiconductor device is manufactured, it may be difficult to perform patterning with high precision in such a manner as to correspond to the design pattern, so that product yield and product reliability may be decreased.

Accordingly, it is desirable to provide a mask pattern forming method that can improve product yield and product reliability.

According to an embodiment of the present invention, there is provided a mask pattern forming method for forming a mask pattern in a Levenson phase shift mask used in a light exposure process for exposing a photoresist film formed on a fabricated film to be patterned into a conductive layer to light when the conductive layer is patterned by photolithography, the conductive layer including a gate electrode formed in an active region extending in a first direction in a wafer in such a manner as to extend with a first width in a second direction orthogonal to the first direction, a first extension part extended from the gate electrode so as to extend with the first width in the second direction, and a second extension part extended from the first extension part so as to extend in the second direction with a second width wider than the first width, the mask pattern forming method including the steps of: arranging, in the first direction, a plurality of phase shifters producing a shifter pattern image by being illuminated as the mask pattern in a mask substrate at an interval such that the gate electrode is interposed between the phase shifters; obtaining the shifter pattern image transferred to the photoresist film when the Levenson phase shift mask in which the phase shifters are arranged in the mask substrate in the phase shifter arranging step is illuminated; obtaining a trim pattern image transferred to the photoresist film when a trim mask in which a trim pattern is disposed so as to correspond to the conductive layer is illuminated; and elongating the phase shifters arranged in the phase shifter arranging step in a direction of going away from a side of the gate electrode in the second direction; wherein the phase shifter elongating step elongates the phase shifters arranged in the phase shifter arranging step such that the shifter pattern image obtained in the shifter pattern image obtaining step and the trim pattern image obtained in the trim pattern image obtaining step do not overlap each other.

According to an embodiment of the present invention, there is provided a patterning method for patterning a conductive layer by photolithography, the conductive layer including a gate electrode formed in an active region extending in a first direction in a wafer in such a manner as to extend with a first width in a second direction orthogonal to the first direction, a first extension part extended from the gate electrode so as to extend with the first width in the second direction, and a second extension part extended from the first extension part so as to extend in the second direction with a second width wider than the first width, the patterning method including the step of exposing a photoresist film formed on a fabricated film to be patterned into a conductive layer to light, the light exposure step including the steps of transferring a shifter pattern image to the photoresist film, the shifter pattern image being produced by illuminating a Levenson phase shift mask in which a plurality of phase shifters are arranged in the first direction at an interval such that the gate electrode is interposed between the phase shifters, and transferring a trim pattern image to the photoresist film, the trim pattern image being produced by illuminating a trim mask in which a trim pattern is disposed so as to correspond to the conductive layer, wherein the phase shifters of the Levenson phase shift mask are elongated in a direction of going away from a side of the gate electrode in the second direction to a position where the shifter pattern image transferred to the photoresist film in the shifter pattern image light exposure step does not overlap the trim pattern image transferred to the photoresist film in the trim pattern image light exposure step.

According to an embodiment of the present invention, it is possible to provide a mask pattern forming method that can improve product yield and product reliability.

BRIEF DESCRIPTION OF THE DRAWINGS

FIG. 3 is a plan view showing phase shifters arranged in the Levenson phase shift mask in the embodiment of the present invention;

FIG. 4 is a flowchart representing operation when it is determined in the embodiment of the present invention whether or not corner rounding parts in the y-direction in shifter pattern images obtained by the arranged phase shifters are included in parts corresponding to gate electrodes in the pattern shape of the arranged phase shifters;

FIGS. 7A, 7B, and 7C are plan views showing a state where the outlines of a shifter pattern image and a trim pattern image are in contact with each other in the embodiment of the present invention;

FIG. 8 is a plan view showing a state where the overlap allowing region is calculated in the embodiment of the present invention;

DETAILED DESCRIPTION OF THE PREFERRED EMBODIMENT

An embodiment of the present invention will be described.

Figure 1:
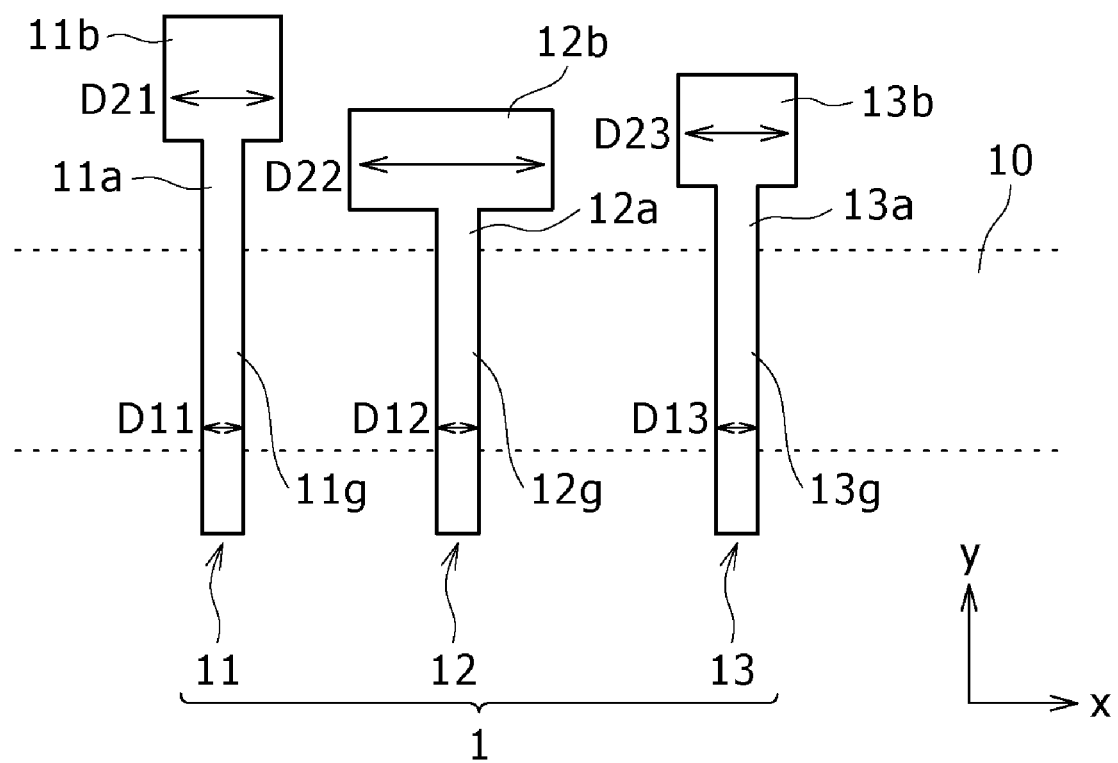
FIG. 1 is a plan view showing a design pattern of a patterned conductive layer in an embodiment of the present invention.

FIG. 1 is a plan view showing a design pattern of a patterned conductive layer in the embodiment of the present invention.

In the present embodiment, as shown in FIG. 1, a first conductive layer 11, a second conductive layer 12, and a third conductive layer 13 are patterned as a conductive layer 1.

In this case, as shown in FIG. 1, the conductive layer 1 is formed by patterning the first conductive layer 11, the second conductive layer 12, and the third conductive layer 13 such that the first conductive layer 11, the second conductive layer 12, and the third conductive layer 13 include gate electrodes 11g, 12g, and 13g, first extension parts 11a, 12a, and 13a, and second extension parts 11b, 12b, and 13b, respectively.

Specifically, as shown in FIG. 1, the gate electrodes 11g, 12g, and 13g extend in a y-direction orthogonal to an x-direction in which an active region 10 extend on a wafer surface, the gate electrodes 11g, 12g, and 13g having predetermined widths D11, D12, and D13. The first extension parts 11a, 12a, and 13a extend in the y-direction from the gate electrodes 11g, 12g, and 13g, the first extension parts 11a, 12a, and 13a having the predetermined widths D11, D12, and D13. The second extension parts 11b, 12b, and 13b extend in the y-direction from the first extension parts 11a, 12a, and 13a, the second extension parts 11b, 12b, and 13b having widths D21, D22, and D23 wider than the widths with which the gate electrodes 11g, 12g, and 13g and the first extension parts 11a, 12a, and 13a extend in the y-direction. That is, the second extension parts 11b, 12b, and 13b extend in the x-direction with the first extension parts 11a, 12a, and 13a as a center, so that the conductive layer 1 is of a shape having eaves.

In the present embodiment, the gate electrodes 11g, 12g, and 13g and the first extension parts 11a, 12a, and 13a in the conductive layer 1 are patterned into the fine widths D11, D12, and D13, using a Levenson phase shift mask in which a plurality of line-shaped phase shifters transmitting light are arranged in the x-direction of a mask substrate at intervals so as to correspond to the gate electrodes 11g, 12g, and 13g and the first extension parts 11a, 12a, and 13a. Then, the second extension parts 11b, 12b, and 13b are patterned using a trim mask having a trim pattern disposed therein so as to correspond to the conductive layer 1. Specifically, a photoresist film formed on a fabricated film to be processed into the conductive layer 1 is exposed to light of a shifter pattern image by illuminating the Levenson phase shift mask, and the photoresist film is exposed to light of a trim pattern image by illuminating the trim mask. The photoresist film resulting from the light exposure is thereafter developed to form a photoresist mask. Then, using the photoresist mask, the fabricated film is etched, whereby the conductive layer 1 is patterned as described above.

Figure 2:
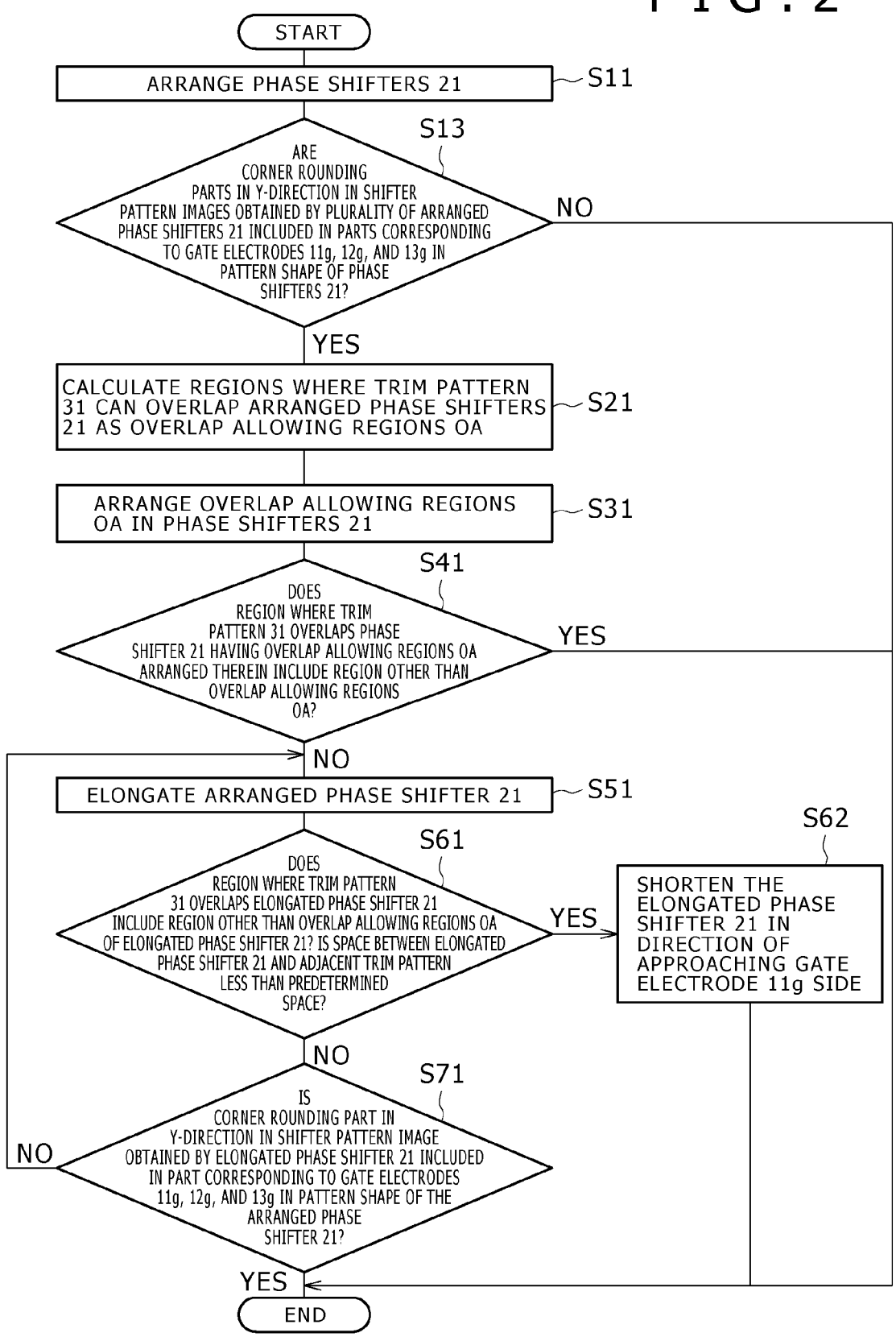
FIG. 2 is a flowchart of assistance in explaining a mask pattern forming method for forming a mask pattern in a Levenson phase shift mask in the embodiment of the present invention.

FIG. 2 is a flowchart of assistance in explaining a mask pattern forming method for forming a mask pattern in the Levenson phase shift mask in the embodiment of the present invention. Incidentally, this operation is performed by a mask pattern forming apparatus including a computer, a program for making the computer perform various operations, a storage device for storing data such as a look-up table or the like used when the program is executed, and an input device for inputting input data such as design pattern data and the like.

First, as shown in FIG. 2, phase shifters 21 are arranged (S11).

FIG. 3 is a plan view showing the phase shifters 21 arranged in the Levenson phase shift mask in relation to the design pattern of the conductive layer 1 in the embodiment of the present invention.

In this case, the computer automatically generates the phase shifters 21 on the basis of design pattern data input for the conductive layer 1. For example, as shown in FIG. 3, the plurality of line-shaped phase shifters 21 producing a shifter pattern image by being illuminated are arranged in the x-direction so as to correspond to respective positions between the first conductive layer 11, the second conductive layer 12, and the third conductive layer 13. That is, as shown in FIG. 3, a first phase shifter 21a, a second phase shifter 21b, a third phase shifter 21c, and a fourth phase shifter 21d are arranged as the phase shifters 21. Specifically, the first phase shifter 21a and the second phase shifter 21b are arranged at an interval such that the first conductive layer 11 is interposed between the first phase shifter 21a and the second phase shifter 21b. The second phase shifter 21b and the third phase shifter 21c are arranged at an interval such that the second conductive layer 12 is interposed between the second phase shifter 21b and the third phase shifter 21c. The third phase shifter 21c and the fourth phase shifter 21d are arranged at an interval such that the third conductive layer 13 is interposed between the third phase shifter 21c and the fourth phase shifter 21d.

Next, as shown in FIG. 2, it is determined whether corner rounding parts in the y-direction in the shifter pattern images 121 obtained by the plurality of arranged phase shifters 21 are included in parts corresponding to the gate electrodes 11g, 12g, and 13g in the pattern shape of the arranged phase shifters 21 (Yes) or not (No) (S13).

FIG. 4 is a flowchart representing operation when it is determined in the embodiment of the present invention whether corner rounding parts in the y-direction in the shifter pattern images 121 obtained by the plurality of arranged phase shifters 21 are included in parts corresponding to the gate electrodes 11g, 12g, and 13g in the pattern shape of the arranged phase shifters 21 (Yes) or not (No).

As shown in FIG. 4, first, the shifter pattern image 121 transferred to the photoresist film when the Levenson phase shift mask having the phase shifters 21 arranged therein is illuminated is obtained (S131).

For example, the shifter pattern image 121 transferred so as to correspond to the arranged phase shifters 21 is obtained using a look-up table including data on a plurality of shifter pattern images simulated in advance. Specifically, the widths of the phase shifters 21 and shifter pattern images produced when the phase shifters 21 are irradiated with light are associated with each other and stored as the look-up table in the storage device. On the basis of data on the width of the arranged phase shifters 21, the computer extracts a shifter pattern image corresponding to the phase shifters 21 from the look-up table.

Next, as shown in FIG. 4, the obtained shifter pattern image 121 and the pattern shape of the phase shifters 21 arranged as described above are compared with each other in a region corresponding to the active region 10 (S132).

Figure 5:
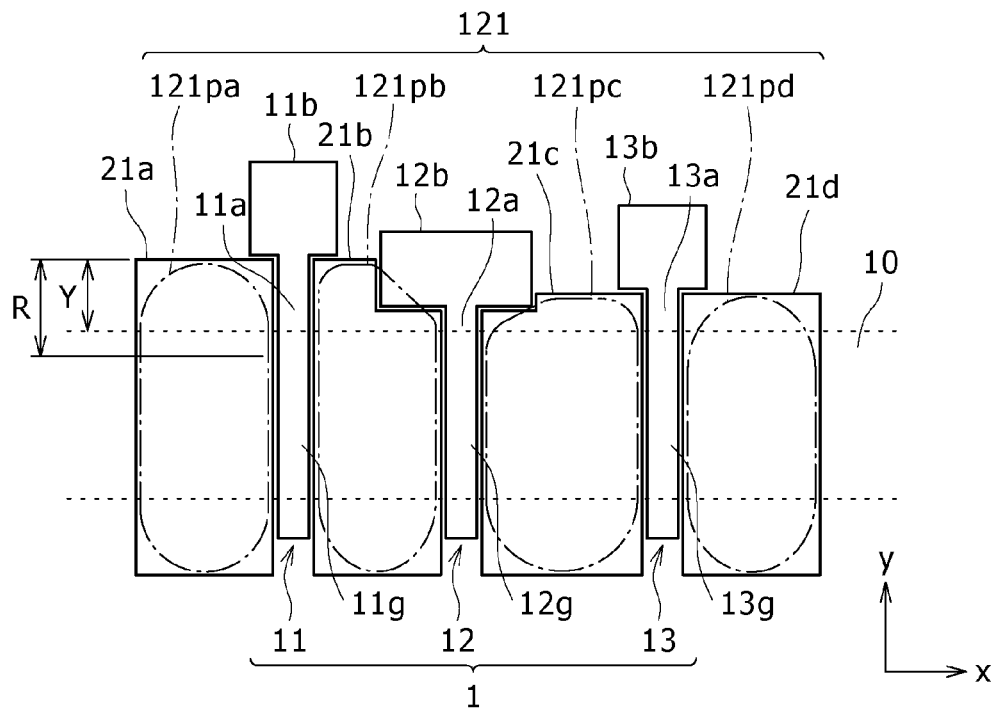
FIG. 5 is a plan view showing a state where the obtained shifter pattern images and the pattern shape of the arranged phase shifters are compared with each other in a region corresponding to an active region in the embodiment of the present invention.

FIG. 5 is a plan view showing a state where the obtained shifter pattern image 121 and the pattern shape of the arranged phase shifters 21 are compared with each other in a region corresponding to the active region 10 in the embodiment of the present invention.

In this case, as shown in FIG. 5, the pattern shapes of the first phase shifter 21a, the second phase shifter 21b, the third phase shifter 21c, and the fourth phase shifter 21d respectively differ in the region corresponding to the active region 10 from a first shifter pattern image 121pa, a second shifter pattern image 121pb, a third shifter pattern image 121pc, and a fourth shifter pattern image 121pd obtained for the respective phase shifters 21. That is, each of the first shifter pattern image 121pa, the second shifter pattern image 121pb, the third shifter pattern image 121pc, and the fourth shifter pattern image 121pd obtained for all of the first phase shifter 21a, the second phase shifter 21b, the third phase shifter 21c, and the fourth phase shifter 21d includes corner rounding parts in the region corresponding to the active region 10. The length of parts rounding in the y-direction in the shifter pattern images 121 is longer than the length of extensions from the active region 10 in the y-direction in the respective phase shifters 21. For example, the length R of a part rounding in the y-direction in the shifter pattern image 121pa produced by the first phase shifter 21a is longer than the length Y of an extension from the active region 10 in the y-direction in the phase shifter 21a.

Thus, in this case, the computer determines that the parts rounding in the y-direction in the shifter pattern images 121 obtained by the arranged phase shifters 21 are included in the parts corresponding to the gate electrodes 11g, 12g, and 13g in the pattern shape of the arranged phase shifters 21. Then, as shown in FIG. 2, the process proceeds to a next step (S21). Incidentally, when the computer determines that the parts rounding in the y-direction in the shifter pattern images 121 obtained by the arranged phase shifters 21 are not included in the parts corresponding to the gate electrodes 11g, 12g, and 13g in the pattern shape of the arranged phase shifters 21, the process is ended for the parts, as shown in FIG. 2.

Next, as shown in FIG. 2, regions where a trim pattern 31 can overlap the arranged phase shifters 21 are calculated as overlap allowing regions OA (S21).

Figure 6:
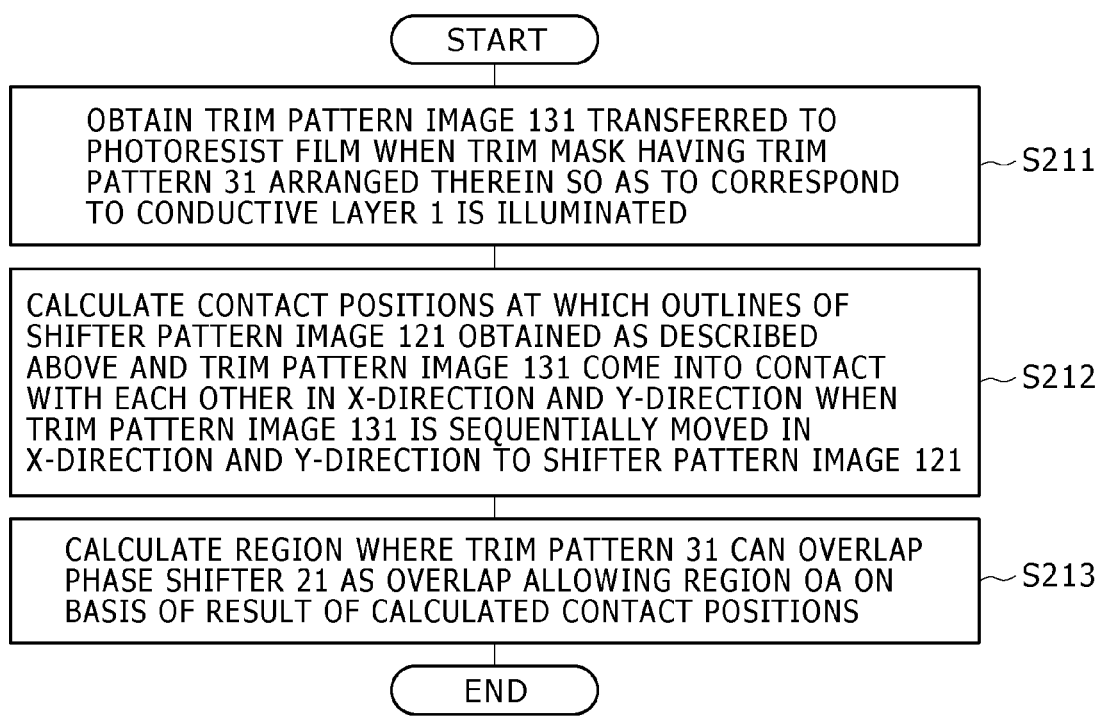
FIG. 6 is a flowchart representing operation for calculating an overlap allowing region in the embodiment of the present invention.

FIG. 6 is a flowchart representing operation for calculating the overlap allowing region OA in the embodiment of the present invention.

In this case, as shown in FIG. 6, a trim pattern image 131 transferred to the photoresist film when the trim mask having the trim pattern 31 arranged therein so as to correspond to the conductive layer 1 is illuminated is obtained (S211).

For example, the computer obtains the trim pattern image 131 transferred so as to correspond to the trim pattern 31, using a look-up table including data on a plurality of trim pattern images simulated in advance. In the present embodiment, a smallest corner rounding part in the trim pattern image is extracted.

Next, a contact position is calculated at which outlines of a shifter pattern image 121 obtained as described above and the trim pattern image 131 come into contact with each other in the x-direction and the y-direction when the trim pattern image 131 is sequentially moved in the x-direction and the y-direction to the shifter pattern image 121 (S212).

FIGS. 7A, 7B, and 7C are plan views showing a state where the outlines of the shifter pattern image 121 and the trim pattern image 131 are in contact with each other in the embodiment of the present invention. FIGS. 7A, 7B, and 7C show the outlines of the shifter pattern image 121 and the trim pattern image 131 coming into contact with each other when the trim pattern image 131 is sequentially moved in the x-direction and the y-direction to the shifter pattern image 121.

In this case, as shown in FIGS. 7A, 7B, and 7C, the computer obtains a plurality of contact positions P11, P12, and P13 at which the outlines of the shifter pattern image 121 and the trim pattern image 131 come into contact with each other in the x-direction and the y-direction when the trim pattern image 131 is sequentially moved in the x-direction and the y-direction to the shifter pattern image 121.

Next, on the basis of the result of the calculated contact positions, the region where the trim pattern 31 can overlap the phase shifter 21 is calculated as an overlap allowing region OA (S213). That is, a region where the shifter pattern image 121 of the phase shifter 21 and the trim pattern image 131 of the trim pattern 31 do not overlap each other when the phase shifter 21 and the trim pattern 31 are made to overlap each other is calculated as an overlap allowing region OA.

FIG. 8 is a plan view showing a state where the overlap allowing region OA is calculated in the embodiment of the present invention.

In this case, as shown in FIG. 8, positions P21, P22, and P23 of a corner part of the trim pattern 31 are obtained from the contact positions P11, P12, and P13 at which the outlines of the shifter pattern image 121 and the trim pattern image 131 come into contact with each other in the x-direction and the y-direction. Then, a triangular region is defined by drawing a straight line between a side at an edge part in the x-direction and a side at an edge part in the y-direction such that the positions P21, P22, and P23 of the corner part of the trim pattern 31 are included within the pattern of the phase shifter 21. The defined triangular region is calculated as overlap allowing region OA by the computer.

Overlap allowing region OA are thus calculated in this step (S21).

Next, the overlap allowing regions OA are arranged in the phase shifters 21 (S31).

Figure 9:
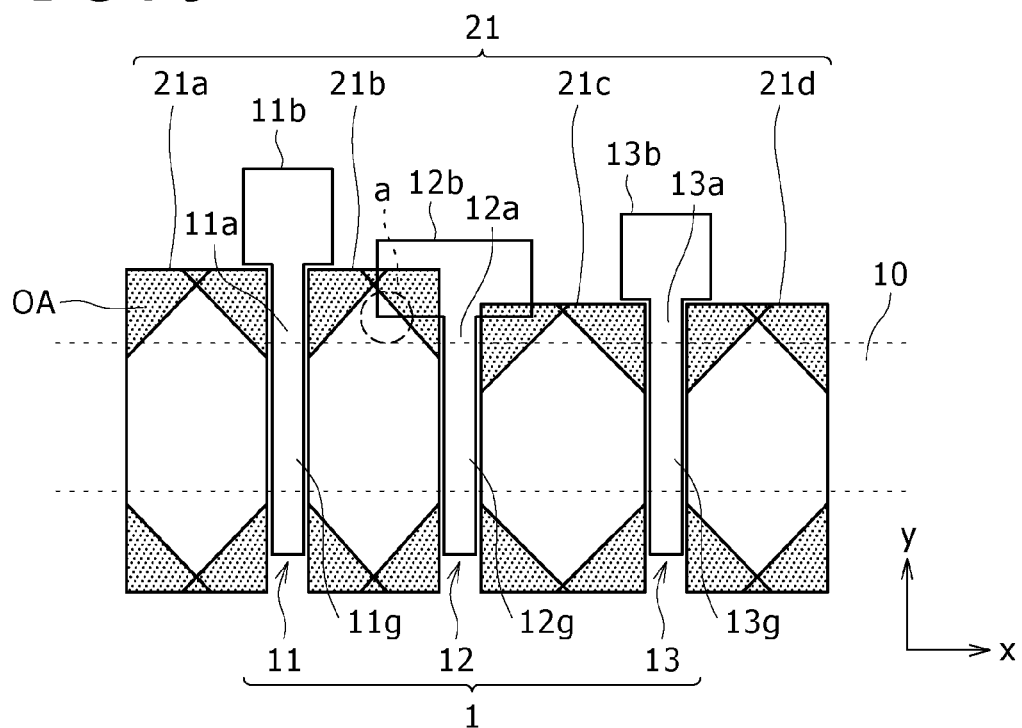
FIG. 9 is a plan view showing a state where overlap allowing regions are arranged in the phase shifters in the embodiment of the present invention.

FIG. 9 is a plan view showing a state where the overlap allowing regions OA are arranged in the phase shifters 21 in the embodiment of the present invention.

In this case, as shown in FIG. 9, the computer arranges the overlap allowing regions OA in the phase shifters 21 such that respective edge parts in the x-direction and the y-direction of the overlap allowing regions OA correspond to respective edge parts in the x-direction and the y-direction of the phase shifters 21.

Next, as shown in FIG. 2, it is determined whether a region where the trim pattern 31 overlaps a phase shifter 21 having an overlap allowing region OA arranged therein includes a region other than the overlap allowing region OA (Yes) or not (No) (S41).

In this case, as shown in FIG. 9, a region where the trim pattern 31 overlaps in an upper edge part of the second phase shifter 21b among the plurality of phase shifters 21 includes a region a other than the overlap allowing region OA. That is, the trim pattern 31 projects from the overlap allowing region OA disposed in the upper edge part of the second phase shifter 21b to the inside of the second phase shifter 21b. In this case, the computer determines that the region where the trim pattern 31 overlaps the phase shifter 21 having the overlap allowing region OA arranged therein includes a region other than the overlap allowing region OA (Yes). Then, in this case, as shown in FIG. 2, the process is ended for this part.

On the other hand, regions where the trim pattern 31 overlaps the first phase shifter 21a, the third phase shifter 21c, and the fourth phase shifter 21d among the plurality of phase shifters 21 do not include a region other than the overlap allowing regions OA, as shown in FIG. 9. In addition, a region where the trim pattern 31 overlaps the lower edge part of the second phase shifter 21b does not include a region other than the overlap allowing region OA.

In this case, the computer determines that the regions where the trim pattern 31 overlaps the phase shifters 21 having the overlap allowing regions OA arranged therein do not include a region other than the overlap allowing regions OA (No).

Then, as shown in FIG. 2, the arranged phase shifters 21 are elongated (S51).

In this case, the arranged phase shifters 21 are elongated in a direction of going away from the side of the gate electrodes 11g, 12g, and 13g in the y-direction. In the present embodiment, the computer elongates the arranged phase shifters 21 such that the shifter pattern images 121 and the trim pattern image 131 do not overlap each other.

Figure 10:
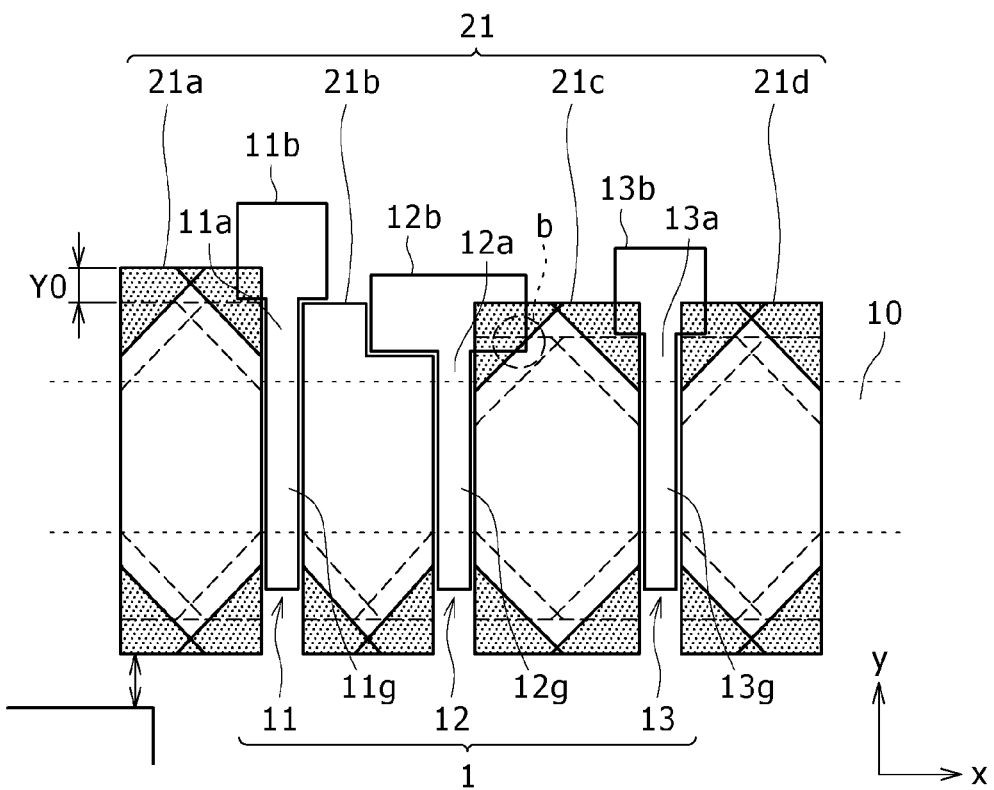
FIG. 10 is a plan view showing a state in which the phase shifters are elongated in the embodiment of the present invention.

FIG. 10 is a plan view showing a state in which the phase shifters 21 are elongated in the embodiment of the present invention.

As described above, regions where the trim pattern 31 overlaps the upper edge parts and lower edge parts of the first phase shifter 21a, the third phase shifter 21c, and the fourth phase shifter 21d among the plurality of phase shifters 21 do not include a region other than the overlap allowing regions OA. Therefore the upper edge parts and lower edge parts of the first phase shifter 21a, the third phase shifter 21c, and the fourth phase shifter 21d are elongated in the direction of going away from the side of the gate electrodes 11g, 12g, and 13g in the y-direction. In addition, the lower edge part of the second phase shifter 21b is similarly elongated. In this case, for example, the elongation in the y-direction is performed by a preset length Y0 shorter than the corner rounding length R in the y-direction.

Next, as shown in FIG. 2, it is determined whether a region where the trim pattern 31 overlaps an elongated phase shifter 21 includes a region other than the overlap allowing region OA of the elongated phase shifter 21 (Yes) or not (No). In addition, whether there is a predetermined space between an elongated phase shifter 21 and an adjacent trim pattern 31 is determined (S61).

In this case, as shown in FIG. 10, a region where the trim pattern 31 overlaps in an upper edge part of the third phase shifter 21c among the elongated phase shifters 21 includes a region b other than the overlap allowing region OA. That is, the trim pattern 31 projects from the overlap allowing region OA disposed in the upper edge part of the third phase shifter 21c to the inside of the third phase shifter 21c. In this case, it is determined that the region where the trim pattern 31 overlaps the phase shifter 21 having the overlap allowing region OA arranged therein includes a region other than the overlap allowing region OA (Yes). In addition, as shown in FIG. 10, the width of a space between the lower edge part of the first phase shifter 21a among the elongated phase shifters 21 and a trim pattern 31 adjacent to the lower edge part of the first phase shifter 21a in a direction of the elongation is smaller than a predetermined width, and therefore it is determined that there is no predetermined space between the lower edge part of the first phase shifter 21a and the trim pattern 31 adjacent to the lower edge part of the first phase shifter 21a in the direction of the elongation.

Then, when the regions where the trim pattern 31 overlaps the elongated phase shifters 21 include a region other than the overlap allowing regions OA, or when there is no predetermined space between the phase shifter 21 and the adjacent trim pattern 31, the elongated phase shifters 21 are shortened in a direction of approaching the gate electrode 11g side, as shown in FIG. 2 (S62).

Figure 11:
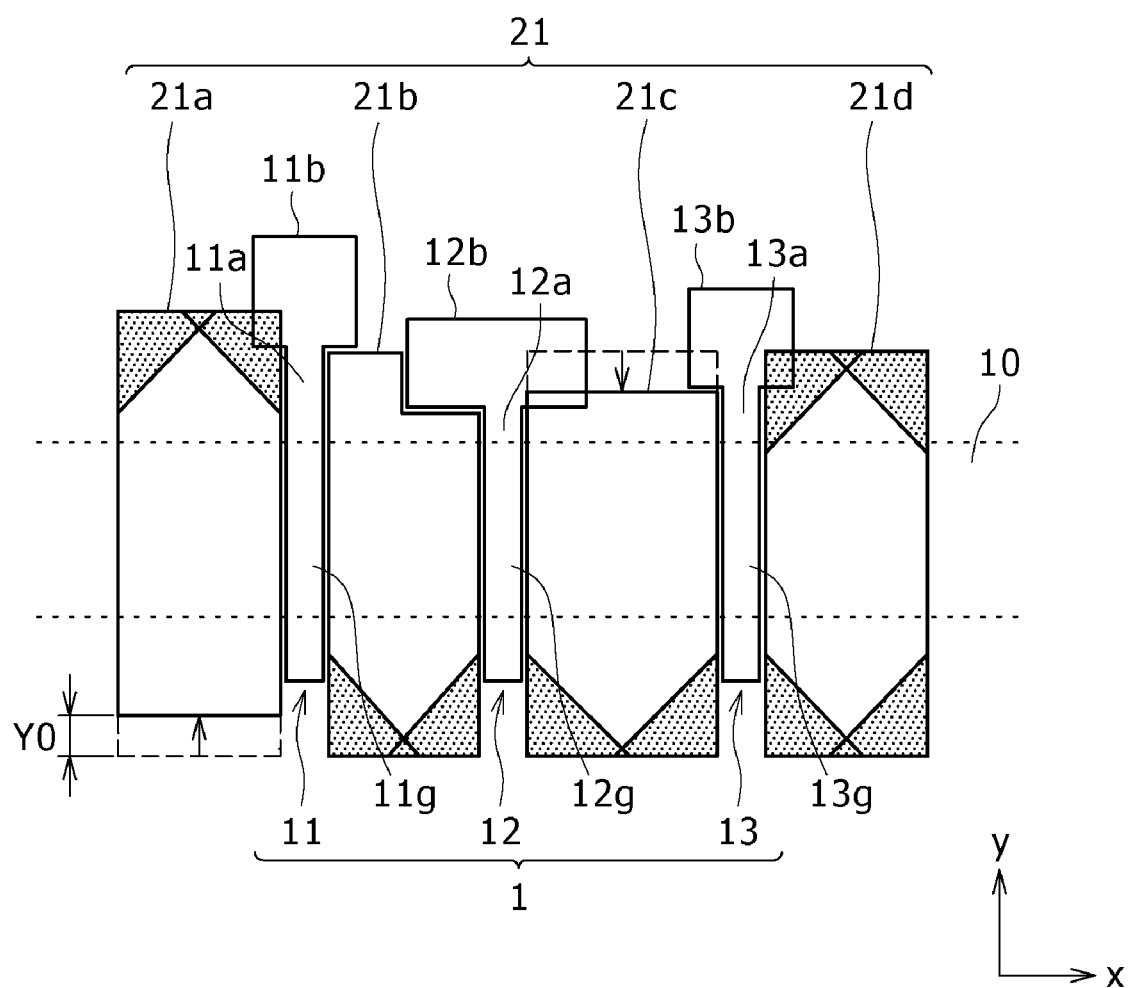
FIG. 11 is a plan view showing a state in which the phase shifters are shortened in the embodiment of the present invention.

FIG. 11 is a plan view showing a state where the phase shifters 21 are shortened in the embodiment of the present invention.

In this case, as shown in FIG. 11, the region where the trim pattern 31 overlaps in the upper edge part of the third phase shifter 21c among the plurality of phase shifters 21 includes a region other than the overlap allowing region OA. Therefore the upper edge part of the third phase shifter 21c is shortened in the direction of approaching the gate electrode 11g side in the y-direction. In this case, the computer shortens the upper edge part of the third phase shifter 21c by the length Y0 by which the elongation is performed in the preceding step. In addition, the lower edge part of the first phase shifter 21a is similarly shortened to the gate electrode 11g side. Then, as shown in FIG. 2, the process is ended for these parts.

On the other hand, as shown in FIG. 11, the region where the trim pattern 31 overlaps the fourth phase shifter 21d among the plurality of phase shifters 21 does not include a region other than the overlap allowing regions OA. In addition, the regions where the trim pattern 31 overlaps the upper edge part of the first phase shifter 21a and the lower edge parts of the second phase shifter 21b and the third phase shifter 21c do not include a region other than the overlap allowing regions OA.

In this case, the computer determines that the regions where the trim pattern 31 overlaps the phase shifters 21 having the overlap allowing regions OA arranged therein do not include a region other than the overlap allowing regions OA (No).

Then, as shown in FIG. 2, it is determined whether corner rounding parts in the y-direction in the shifter pattern images obtained by the elongated phase shifters 21 are included in the parts corresponding to the gate electrodes 11g, 12g, and 13g in the pattern shape of the elongated phase shifters 21 (Yes) or not (No) (S71).

In this step, as in the above-described step (S13), the computer determines whether the length R of a part rounding in the y-direction in a shifter pattern image 121 obtained by the elongated phase shifter 21 is longer than the length Y of an extension from the active region 10 in the y-direction in the elongated phase shifter 21.

Specifically, when the length R of the part rounding in the y-direction in the shifter pattern image 121 obtained by the elongated phase shifter 21 is longer than the length Y of the extension from the active region 10 in the y-direction in the elongated phase shifter 21, it is determined that the part rounding in the y-direction direction in the shifter pattern image obtained by the elongated phase shifter 21 is included in the parts corresponding to the gate electrodes 11g, 12g, and 13g in the pattern shape of the elongated phase shifters 21 (Yes). Then, as shown in FIG. 2, the phase shifter 21 is elongated (S51). Then similar processes are sequentially repeated.

On the other hand, when the length R of the part rounding in the y-direction in the shifter pattern image 121 obtained by the elongated phase shifter 21 is not longer than the length Y of the extension from the active region 10 in the y-direction in the elongated phase shifter 21, the process is ended as shown in FIG. 2.

Figure 12:
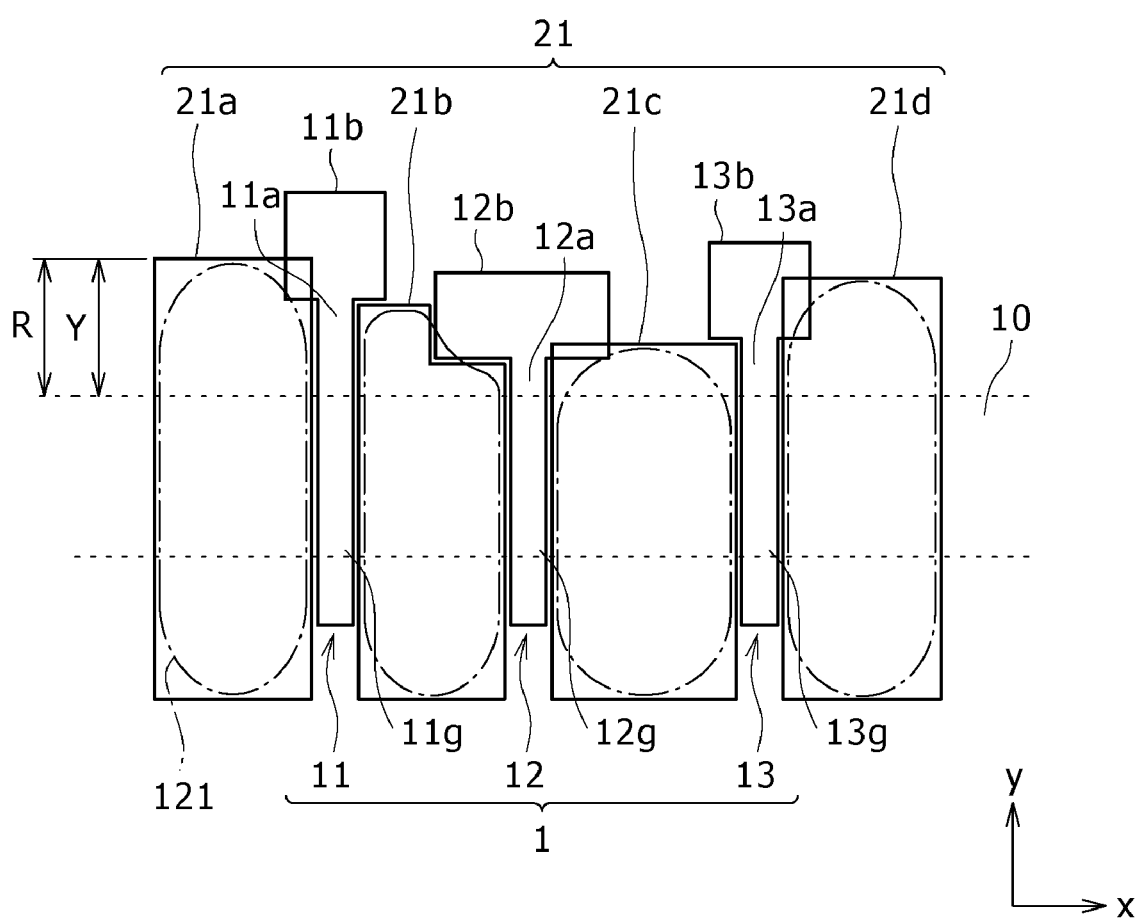
FIG. 12 is a plan view showing the phase shifters formed and arranged in the embodiment of the present invention and shifter pattern images produced in the phase shifters.
Figure 13A:
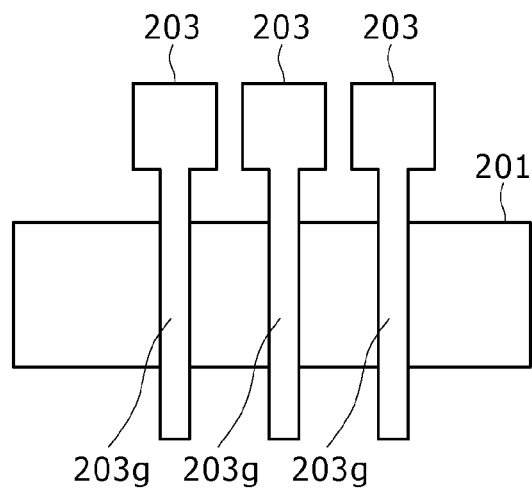
FIGS. 13A, 13B, and 13C are plan views showing a conductive layer including gate electrodes, and a Levenson phase shift mask and a trim mask used to form the conductive layer.
Figure 13B:
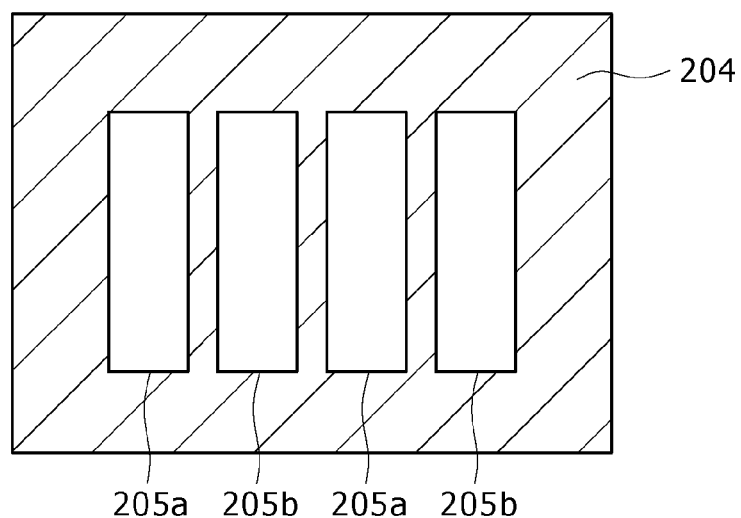
Figure 13C:
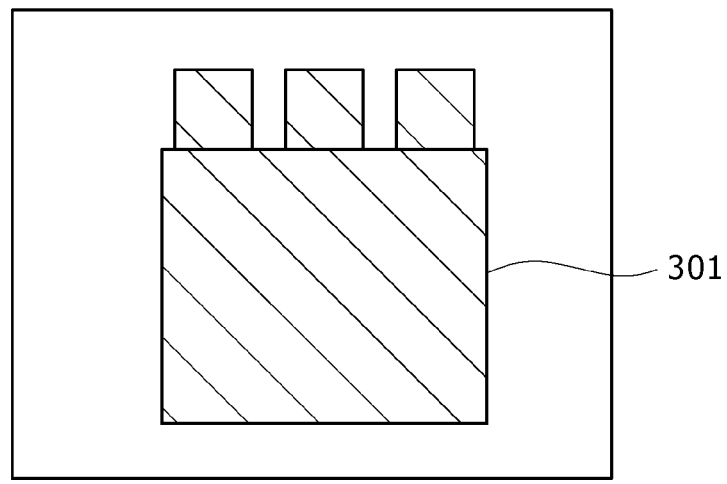
Figure 14:
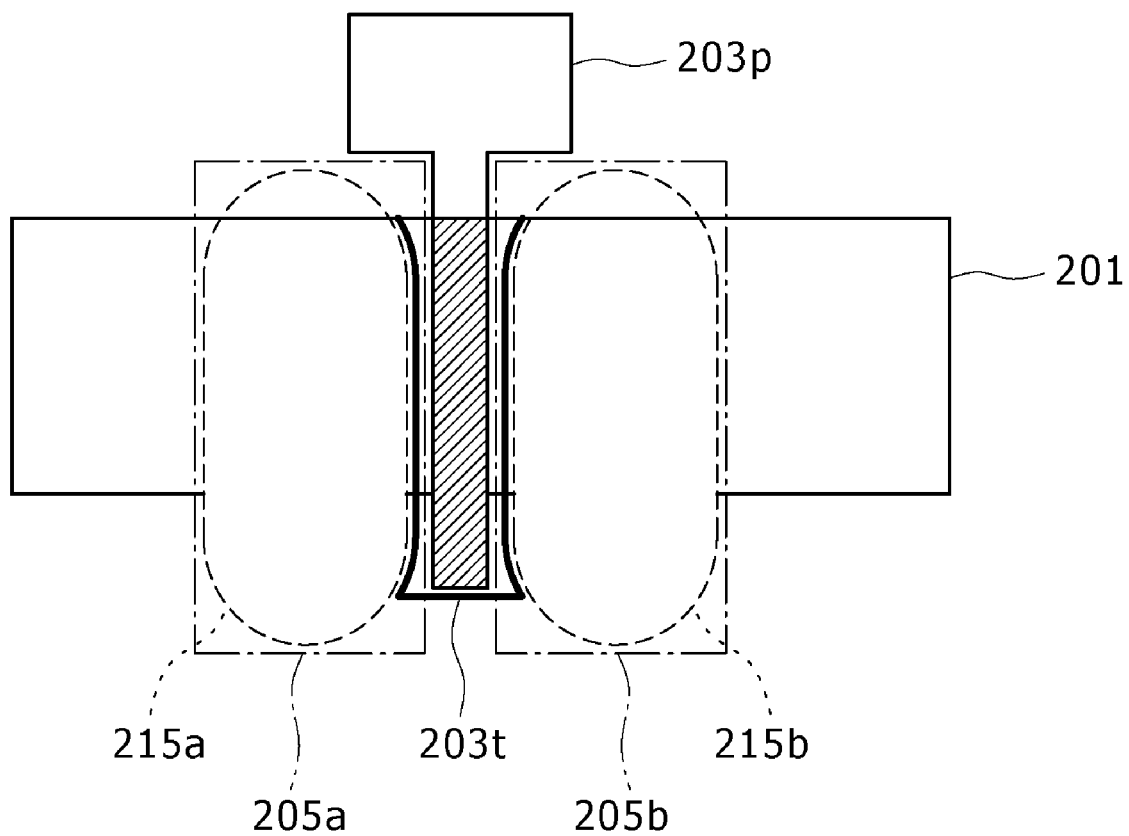
FIG. 14 is a plan view showing the shape of phase shifters of the Levenson phase shift mask and the shape of a pattern transferred to a photoresist film in a region where a gate electrode is formed.

FIG. 12 is a plan view showing the phase shifters 21 formed and arranged in the embodiment of the present invention and the shifter pattern images 121 produced in the phase shifters.

As shown in FIG. 12, the phase shifters 21 are formed such that the length R of the parts rounding in the y-direction in the shifter pattern images 121 is not longer than the length Y of the extensions from the active region 10 in the y-direction in the phase shifters 21.

Then a Levenson phase shift mask having the phase shifters 21 arranged therein is formed. That is, the Levenson phase shift mask is formed by elongating the phase shifters 21 in the direction of going away from the gate electrodes 11g, 12g, and 13g in the y-direction such that the shifter pattern images 121 do not overlap the trim pattern image 131 in a direction from the parts corresponding to the gate electrodes 11g, 12g, and 13g to the second extension parts 11b, 12b, and 13b in the design pattern of the conductive layer 1. In this case, the phase shifters 21 are formed such that the phase of transmitted light is alternately inverted between adjacent phase shifters 21.

Then the above-mentioned conductive layer 1 is patterned using the Levenson phase shift mask. In this case, a fabricated film to be processed into the conductive layer 1 is formed on a wafer, using a conductive material such as polysilicon or the like.

Thereafter, a positive type photoresist film, for example, is formed on the formed fabricated film, and then a light exposure process is performed.

In this light exposure process, as described above, the Levenson phase shift mask having the plurality of phase shifters 21 arranged therein at intervals in the x-direction such that the gate electrodes 11 are interposed between the phase shifters 21 is illuminated, whereby a shifter pattern image produced by the illumination is transferred to the photoresist film. In this case, the Levenson phase shift mask having parts corresponding to the gate electrodes 11 as light shielding parts and having the plurality of phase shifters 21 arranged therein at intervals in the x-direction such that the light shielding parts are interposed between the phase shifters 21 is illuminated, whereby a shifter pattern image produced by the illumination is transferred to the photoresist film. Further, the trim mask in which a trim pattern corresponding to the conductive layer 1 is disposed as a light shielding part is illuminated, whereby a trim pattern image produced by the illumination is transferred to the photoresist film. Then, the photoresist film to which the shifter pattern and the trim pattern are transferred is developed, whereby a photoresist mask is formed on the surface of the wafer. The fabricated film is thereafter etched using the photoresist mask, and thereby patterned into the conductive layer 1.

As described above, in the present embodiment, the phase shifters 21 producing the shifter pattern images 121 in the Levenson phase shift mask are elongated from the parts corresponding to the gate electrode 11g to the outside such that the shifter pattern images 121 and the trim pattern image 131 produced by multiple exposure do not overlap each other in a direction from the parts corresponding to the gate electrode 11g to the outside. In this case, the phase shifters 21 are elongated such that corner rounding parts of the shifter pattern images produced by illuminating the phase shifters 21 are not included in the active region 10. In patterning the conductive layer 1 including the gate electrode 11g, a light exposure process is performed in which process the photoresist film formed on the fabricated film to be processed into the conductive layer 1 is exposed to light. In this light exposure process, as described above, the Levenson phase shift mask having the plurality of phase shifters 21 arranged therein at intervals in the x-direction such that the gate electrodes 11 are interposed between the phase shifters 21 is illuminated, whereby the shifter pattern images 121 produced by the illumination are transferred to the photoresist film. Further, the trim mask in which the trim pattern corresponding to the conductive layer 1 is disposed is illuminated, whereby the trim pattern image 131 produced by the illumination is transferred to the photoresist film. In this case, as described above, the phase shifters 21 of the Levenson phase shift mask are elongated to positions where the shifter pattern images 121 do not overlap the trim pattern image 131, in the direction of going away from the gate electrode 11g side in the y-direction. It is therefore possible to prevent the corner rounding parts of the shifter pattern images 121 from overlapping the active region 10. Hence, the gate electrode 11g can be formed with a desired line width so as to correspond to a design pattern in the active region 10. Therefore desired transistor characteristics are easily obtained, and a short circuit between the conductive layer 1 and another adjacent conductive layer can be prevented. Thus, the present embodiment can facilitate patterning with high precision, improve product yield, and improve product reliability.

The present embodiment compares the pattern shapes of the arranged phase shifters 21 with the shifter pattern images 121 produced by the phase shifters 21 in a region corresponding to the active region 10, and elongates the arranged phase shifters 21 when a result of the comparison indicates that the pattern shapes of the arranged phase shifters 21 and the shapes of the shifter pattern images 121 differ from each other in the region corresponding to the active region 10. That is, of the plurality of phase shifters 21, a phase shifter 21 whose shifter pattern image 121 includes a corner rounding part in the region corresponding to the active region 10 is elongated in the y-direction. Therefore the present embodiment can generate, with high efficiency, a mask pattern for the Levenson phase shift mask capable of being patterned with high precision.

In addition, the present embodiment calculates contact positions at which the outlines of a shifter pattern image 121 and the trim pattern image 131 come into contact with each other in the x-direction and the y-direction when the trim pattern image 131 is moved in the x-direction and the y-direction to the shifter pattern image 121. Thereafter, on the basis of the result of the calculated contact positions, a region where the trim pattern 31 can overlap the phase shifter 21 is calculated as an overlap allowing region OA. Then, the overlap allowing region OA is disposed such that an edge part in the y-direction of the overlap allowing region OA corresponds to an edge part in the y-direction of the arranged phase shifter 21. Then, when a region where the trim pattern 31 overlaps the phase shifter 21 having the overlap allowing region OA arranged therein does not include a region other than the overlap allowing region OA, the arranged phase shifter 21 is elongated. Then, when the region where the trim pattern 31 overlaps the elongated phase shifter 21 includes a region other than the overlap allowing region OA, the elongated phase shifter 21 is shortened in a direction of approaching the gate electrode 11 side. Thus, in the present embodiment, the arranged phase shifter 21 is elongated such that the shifter pattern image 121 and the trim pattern image 131 do not overlap each other. The present embodiment can therefore facilitate patterning with high precision, improve product yield, and improve product reliability.

It should be understood by those skilled in the art that various modifications, combinations, sub-combinations and alterations may occur depending on design requirements and other factors insofar as they are within the scope of the appended claims or the equivalents thereof.

What is claimed is:

1. A mask pattern generating method for generating a mask pattern to be formed in a Levenson phase shift mask used in a light exposure process for exposing a photoresist film formed on a fabricated film to be patterned into a conductive layer to light when said conductive layer is patterned by photolithography, said conductive layer including a gate electrode formed in an active region extending in a first direction in a wafer in such a manner as to extend in a second direction orthogonal to said first direction, said mask pattern generating method comprising the steps of:

arranging, in said first direction, a plurality of phase shifters producing a shifter pattern image by being illuminated as said mask pattern at an interval such that said gate electrode is interposed between said phase shifters;

obtaining the shifter pattern image transferred to said photoresist film when the Levenson phase shift mask in which said phase shifters are arranged in said phase shifter arranging step is illuminated;

obtaining a trim pattern image transferred to said photoresist film when a trim mask in which a trim pattern is disposed so as to correspond to said conductive layer is illuminated; and elongating said phase shifters arranged in said phase shifter arranging step in a direction of going away from a side of said gate electrode in said second direction;

wherein said phase shifter elongating step elongates said phase shifters arranged in said phase shifter arranging step to a position in the direction of going away from the side of said gate electrode in said second direction such that the shifter pattern image obtained in said shifter pattern image obtaining step and the trim pattern image obtained in said trim pattern image obtaining step do not overlap each other.

2. The mask pattern generating method as claimed in claim 1, further comprising the step of comparing the shifter pattern image obtained in said shifter pattern image obtaining step with pattern shape of said phase shifters arranged in said phase shifter arranging step in a region corresponding to said active region, wherein when a result of comparison in said comparing step indicates that the shifter pattern image obtained in said shifter pattern image obtaining step differs from the pattern shape of said phase shifters arranged in said phase shifter arranging step in the region corresponding to said active region, said phase shifter elongating step elongates said phase shifters arranged in said phase shifter arranging step.

3. The mask pattern generating method as claimed in claim 2, further comprising the steps of:

calculating contact positions at which outlines of said shifter pattern image obtained in said shifter pattern image obtaining step and said trim pattern image obtained in said trim pattern image obtaining step come into contact with each other in said first direction and said second direction when said trim pattern image is moved in said first direction and said second direction to said shifter pattern image, and calculating regions where said trim pattern is allowed to overlap said phase shifters arranged in said phase shifter arranging step as overlap allowing regions on a basis of a result of the calculated contact positions; and arranging said overlap allowing regions calculated in said overlap allowing region calculating step such that edge parts in said second direction of said overlap allowing regions correspond to edge parts in said second direction of said phase shifters arranged in said phase shifter arranging step;

wherein said phase shifter elongating step elongates said phase shifters arranged in said phase shifter arranging step when regions where said trim pattern overlaps said phase shifters in which said overlap allowing regions are arranged in said overlap allowing region arranging step do not include a region other than said overlap allowing regions.

4. The mask pattern generating method as claimed in claim 3, further comprising the step of shortening a phase shifter elongated in said phase shifter elongating step in a direction of approaching the side of said gate electrode when a region where said trim pattern overlaps said phase shifter elongated in said phase shifter elongating step include a region other than said overlap allowing regions.

* * * * *